US012751031B2

(12) United States Patent
Huang et al.

(10) Patent No.: US 12,751,031 B2
(45) Date of Patent: Sep. 29, 2026

(54) FIELD EFFECT TRANSISTOR HAVING SAME GATE AND SOURCE DOPING, CELL STRUCTURE, AND PREPARATION METHOD

(71) Applicant: PN Junction Semiconductor (Hangzhou) Co., Ltd., Hangzhou (CN)

(72) Inventors: Xing Huang, Hangzhou (CN); Xin Lu Chen, Hangzhou (CN)

(73) Assignee: PN Junction Semiconductor (Hangzhou) Co., Ltd., Hangzhou (CN)

(*) Notice: Subject to any disclaimer, the term of this patent is extended or adjusted under 35 U.S.C. 154(b) by 742 days.

(21) Appl. No.: 17/920,301

(22) PCT Filed: Oct. 28, 2020

(86) PCT No.: PCT/CN2020/124344
§ 371 (c)(1),
(2) Date: Oct. 20, 2022

(87) PCT Pub. No.: WO2021/212793
PCT Pub. Date: Oct. 28, 2021

(65) Prior Publication Data

US 2023/0178636 A1 Jun. 8, 2023

(30) Foreign Application Priority Data

Apr. 20, 2020 (CN) ......................... 202010313779.8
Jul. 20, 2020 (CN) ......................... 202010700174.4
Jul. 24, 2020 (CN) ......................... 202010725690.2

(51) Int. Cl.
*H10D 30/01* (2025.01)
*H10D 30/60* (2025.01)
(Continued)

(52) U.S. Cl.
CPC ......... *H10D 30/051* (2025.01); *H10D 30/615* (2025.01); *H10D 30/711* (2025.01); *H10D 62/8325* (2025.01)

(58) Field of Classification Search
CPC .. H10D 30/051; H10D 30/615; H10D 30/711; H10D 62/8325; H10D 30/831;
(Continued)

(56) References Cited

U.S. PATENT DOCUMENTS 5,747,831 A * 5/1998 Loose ................. H10D 30/831 257/334
2006/0071295 A1 4/2006 Chang
(Continued)

FOREIGN PATENT DOCUMENTS

CN 105493291 A 4/2016
CN 106711207 A 5/2017
(Continued)

OTHER PUBLICATIONS

Translation of Hidekatsu (JP-2005072162A) (Year: 2005).*
(Continued)

*Primary Examiner* — William B Partridge
*Assistant Examiner* — Ilker Ozden
(74) *Attorney, Agent, or Firm* — Osha Bergman Watanabe & Burton LLP

(57) ABSTRACT

A cell structure for a field effect transistor having same gate and source doping includes: a silicon carbide substrate with a doping type of a first conductivity type; a semiconductor epitaxial layer of the first conductivity type and a first electrode respectively provided on front and back faces of the silicon carbide substrate; and a floating region of a second conductivity type, a gate implantation region of the first conductivity type, and a source implantation region of the first conductivity type sequentially provided on the
(Continued)

semiconductor epitaxial layer of the first conductivity type, wherein a gate is provided on the gate implantation region, a source is provided on the source implantation region, an inter-electrode dielectric is provided between the gate implantation region and the source implantation region, and the inter-electrode dielectric is used for isolating the gate from the source.

16 Claims, 8 Drawing Sheets

(51) Int. Cl.
*H10D 30/69* (2025.01)
*H10D 62/832* (2025.01)

(58) Field of Classification Search
CPC .. H10D 12/031; H10D 62/105; H10D 62/106; H10D 62/117; H10D 62/127; H10D 62/328
See application file for complete search history.

(56) References Cited

U.S. PATENT DOCUMENTS

2009/0068803 A1* 3/2009 Treu .................... H10D 64/256 438/192
2010/0207126 A1 8/2010 Santi et al.
2013/0146886 A1* 6/2013 Disney ................ H10D 30/831 257/E29.313
2014/0048903 A1* 2/2014 Edwards ............. H10D 30/051 257/E29.338
2016/0268446 A1* 9/2016 Bhalla ................ H10D 30/0515
2016/0380117 A1* 12/2016 Bhalla .................. H10D 30/831 257/77
2017/0018657 A1 1/2017 Li et al.
2018/0076286 A1 3/2018 Inomata
2018/0226513 A1* 8/2018 Li ........................ H10D 30/831
2021/0391481 A1* 12/2021 Papadopoulos ........ H10D 62/53

FOREIGN PATENT DOCUMENTS

CN 108028203 A 5/2018
CN 111509034 A 8/2020
JP 200572162 A 3/2005
JP 2005072162 A * 3/2005

OTHER PUBLICATIONS

Translation of JP 2005072162 A (Hidekatsu) (Year: 2005).*
Translation of JP 2005072162 A (Year: 2005).*
International Search Report issued in International Application No. PCT/CN2020/124344 dated Jan. 28, 2021 (2 pages).
Written Opinion issued in International Application No. PCT/CN2020/124344 dated Jan. 28, 2021 (7 pages).
Decision of Refusal issued in Japanese Application No. 2022-564223, mailed on Dec. 12, 2023 (12 pages).
Extended European Search Report issued in corresponding EP Application No. 20931964.9 dated Apr. 18, 2024 (10 pages).

* cited by examiner

FIELD EFFECT TRANSISTOR HAVING SAME GATE AND SOURCE DOPING, CELL STRUCTURE, AND PREPARATION METHOD

FIELD OF THE INVENTION

The present disclosure belongs to the field of semiconductor technology, and in particular relates to a field effect transistor having the same gate and source doping, a cell structure, and a preparation method.

BACKGROUND OF THE INVENTION

With the development and maturity of material technologies, the wide bandgap characteristics of SiC materials allow higher temperature characteristics and voltage endurance characteristics thereof, which can break through the limitations of Si-based devices. Because the performance and reliability of SiC/SiO2 interfaces still need to be further improved, the structures of SiC Junction Field Effect Transistor (JFET) device have received extensive attention. In addition to avoiding the problems caused by $SiC/SiO_2$ interface defects, it is easier to reduce a cell size of SiC JFETs to reach lower on-resistance. Because more interface states are excited in $SiO_2$ at high temperatures, SiC JFET devices may maximize the characteristics of SiC materials at high temperatures and high pressures.

A traditional SiC JFET is controlled by PN junctions. Charge carriers flow out from a source of a device, then pass through a long and narrow channel region, flow into a drift region of the device, and are finally collected by a drain of the device. The channel of the device is controlled by two PN junctions located between the gate and the source, so as to control the turn-off and turn-on of the device. However, a P-type gate of the traditional JFET brings many adverse effects on the device application level: first, when the device is turned on, in order to avoid the turn-on of the PN junctions, a gate bias voltage Vgs of the device cannot exceed the forward cut-in voltage $V_{F0}$ of the PN junctions (taking silicon carbide for example, $V_{F0}$=2.6 V, that is, Vgs<$V_{F0}$); meanwhile, if the device is normally-on, when it is turned on at zero gate bias voltage, a built-in potential (hereinafter referred to as "gate built-in potential") formed between the P-type gate and the N-type channel depletes the channel to a certain extent, resulting in relatively high channel resistance; and when the device is operating at a high current (nearly saturated), the gate built-in potential causes the channel to enter a pinch-off state prematurely, resulting in premature current saturation and excessive conduction loss during this operation.

SUMMARY OF THE INVENTION

In view of the above existing technical problems, the present disclosure provides a field effect transistor having same gate and source doping, a cell structure, and a preparation method.

In order to solve the above technical problems, the present disclosure adopts the following technical solutions.

A first aspect of the present disclosure provides a cell structure for a field effect transistor having same gate and source doping, including:

- a silicon carbide substrate, wherein a doping type of a material of the silicon carbide substrate is a first conductivity type,

- a semiconductor epitaxial layer of the first conductivity type and a first electrode respectively provided on front and back faces of the silicon carbide substrate; and
- a floating region of a second conductivity type, a gate implantation region of the first conductivity type, and a source implantation region of the first conductivity type sequentially provided on the semiconductor epitaxial layer of the first conductivity type, wherein a gate is provided on the gate implantation region, a source is provided on the source implantation region, an inter-electrode dielectric is provided between the gate implantation region and the source implantation region, and the inter-electrode dielectric is used for isolating the gate from the source.

Preferably, a portion of the floating region (005) of the second conductivity type in contact with the source implantation region (007) of the first conductivity type has the same structure as the source implantation region (007) of the first conductivity type, and both are provided with terminal sharp angles.

Preferably, the terminal sharp angles are 0-180 degrees.

Preferably, the semiconductor epitaxial layer (002) of the first conductivity type has a thickness of 5-250 μm and a doping concentration of $1\times10^{14}$ $cm^{-3}$-$5\times10^{18}$ $cm^{-3}$.

Preferably, the gate implantation region on one side of the cell is connected to the gate, and the gate implantation region on another side of the cell and the source implantation region are jointly connected to the source.

Preferably, the doping for the first conductivity type and the second conductivity type is a uniform or non-uniform doping of $1\times10^{14}$ $cm^{-3}$-$2\times10^{21}$ $cm^{-3}$.

Preferably, the first conductivity type is N type, and the second conductivity type is P type.

Preferably, the first conductivity type is P type, and the second conductivity type is N type.

A second aspect of the present disclosure provides a field effect transistor having same gate and source doping, the field effect transistor including a plurality of cell structures as described above and a field limiting ring junction termination. When the junction termination is fabricated, the junction termination and the floating regions of the second conductivity type of the cell structures are etched and implanted simultaneously using the same photolithography mask.

A third aspect of the present disclosure provides a field effect transistor having same gate and source doping, the field effect transistor including a plurality of cell structures as described above, a junction termination extension, and a junction termination with field limiting rings. When the junction termination is fabricated, the junction termination and the floating regions of the second conductivity type of the cell structures are etched and implanted simultaneously using the same photolithography mask.

A fourth aspect of the present disclosure provides a method for preparing a cell structure for a field effect transistor having same gate and source doping. The method includes the following steps.

(a) A silicon carbide substrate with a doping type of a first conductivity type is used. A semiconductor epitaxial layer of the first conductivity type is provided on a front face of the silicon carbide substrate. Using a photolithography plate (photolithography mask) to shield a portion of the surface, a silicon carbide mesa is formed by an etching process with an etching depth of 0.5 to 5 μm.

(b) Ion implantation of a floating region is performed by using the same photolithography mask. The specific process includes forming a floating region of the second conductivity type by at least one tilt implantation and vertical implantation of Al ions, so that bottom and side walls of a trench are uniformly implanted.

(c) The mask layer is peeled off and vertical N implantation is performed to form a gate implantation region and a source implantation region of the first conductivity type.

(d) A dielectric layer is grown on the side walls of the trench as an electrode isolation dielectric to isolate a gate from a source.

(e) A metal is deposited and an alloy is formed, by annealing, on surfaces of the gate implantation region, the source implantation region, and the substrate of the first conductivity type, respectively, as ohmic contacts. The alloy contains at least one of a silicide or a carbide.

Preferably, the steps further include: adding at least one tilt implantation to form a channel implantation region.

Preferably, the first conductivity type is N type, and the second conductivity type is P type.

Preferably, the first conductivity type is P type, and the second conductivity type is N type.

A fifth aspect of the present disclosure provides a method for preparing a field effect transistor having same gate and source doping, the field effect transistor including a plurality of cell structures and a field limiting ring junction termination. The cell structures are prepared by any of the methods as described above, and when the junction termination is fabricated, the junction termination and the floating regions of the second conductivity type of the cell structures are etched and implanted simultaneously using the same photolithography mask.

A sixth aspect of the present disclosure provides a method for preparing a field effect transistor having same gate and source doping, the field effect transistor including a plurality of cell structures, a junction termination extension, and a junction termination with field limiting rings. The cell structures are prepared by any of the methods as described above, and when the junction termination is fabricated, the junction termination and the floating regions of the second conductivity type of the cell structures are etched and implanted simultaneously using the same photolithography mask.

The present disclosure has the following beneficial effects.

(1) On the basis of the traditional JFET, a gate of a first conductivity type and a floating region of a second conductivity type that surrounds the gate are introduced to control the channel of the device, whereby the forward bias voltage of the gate of the device can be increased so that Vgs can be biased at a position greater than a forward cut-in voltage of a PN junction.

(2) When Vgs=0 V, because there is no reverse bias introduced by the built-in potential in the PN junction at the channel, the on-resistance of the device is lower.

(3) When turned on at a high current, the device enters a saturation state to conduct higher current.

(4) One gate is connected to the source, so that the structure allows a reduced Cgd, thereby reducing a switching loss.

(5) By introducing the floating region of the second conductivity type having terminal sharp angles, the implantation of the floating region of the second conductivity type can be completed by implantation in two directions, and the problem of the gate and the source become short-circuited during the implantation in two directions is solved.

BRIEF DESCRIPTION OF THE DRAWINGS

FIG. 12 is a schematic structural diagram of separation of a space charge region when the device is turned on;

DETAILED DESCRIPTION OF THE EMBODIMENTS

The technical solutions in the embodiments of the present disclosure will be clearly and completely described below with reference to the accompanying drawings in the embodiments of the present disclosure. Apparently, the described embodiments are some, but not all, of the embodiments of the present disclosure. All other embodiments obtained by a person of ordinary skill in the art based on the embodiments of the present disclosure without creative efforts shall fall within the protection scope of the present disclosure.

Method Embodiment 1

Figure 1:
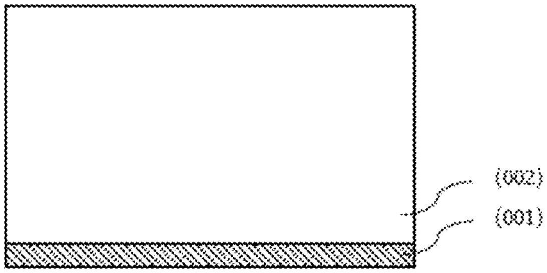
FIG. 1 is a schematic structural diagram of providing a semiconductor epitaxial layer of a first conductivity type on a front surface of a silicon carbide substrate according to method embodiment 1.
Figure 2:
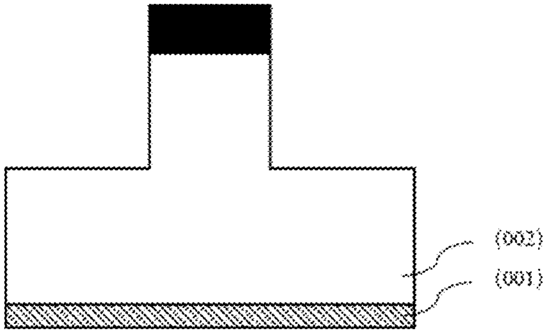
FIG. 2 is a schematic structural diagram of etching a silicon carbide mesa by an etching process according to Method Embodiment 1.

An embodiment of the present disclosure discloses a method for preparing a cell structure for a field effect transistor having same gate and source doping, including the following steps:

(a) With reference to FIG. 1 and FIG. 2, a silicon carbide substrate 001 with a doping type of a first conductivity type is used. A semiconductor epitaxial layer 002 of the first conductivity type is provided on a front face of the silicon carbide substrate 001. Using a photolithography plate (photolithography mask) to shield a portion of the surface, a silicon carbide mesa is etched using Inductively Coupled Plasma (ICP), with an etching depth of 0.5 to 5 μm. Other etching processes may also be used.

Figure 3:
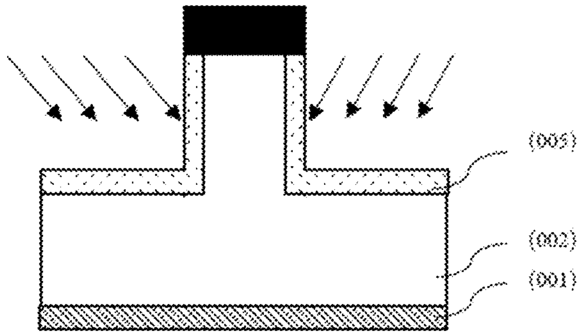
FIG. 3 is a schematic structural diagram of forming a floating region of a second conductivity type according to Method Embodiment 1.

(b) With reference to FIG. 3, ion implantation of a floating region is performed by using the same photolithography mask. The specific process includes forming a floating region 005 of the second conductivity type by at least one tilt implantation and vertical implantation of Al ions, so that bottom and side walls of a trench are uniformly implanted.

Figure 4:
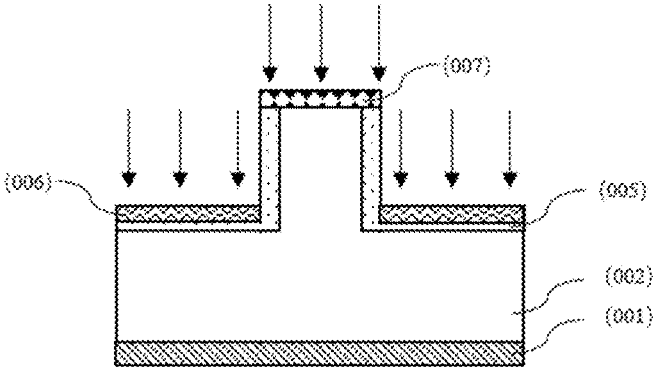
FIG. 4 is a schematic structural diagram of forming a gate implantation region and a source implantation region according to Method Embodiment 1.

(c) With reference to FIG. 4, the mask layer is peeled off, and vertical N implantation is performed to form a gate implantation region 006 and a source implantation region 007 of the first conductivity type, which then form good ohmic contacts with a metal.

Figure 5:
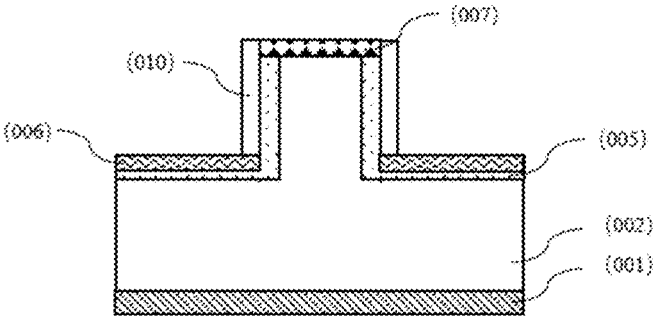
FIG. 5 is a schematic structural diagram of forming an electrode isolation dielectric according to Method Embodiment 1.

(d) With reference to FIG. 5, a dielectric layer is grown on the side walls of the trench as an electrode isolation dielectric 010 to isolate the gate implantation region 006 from the source implantation region 007.

Figure 6:
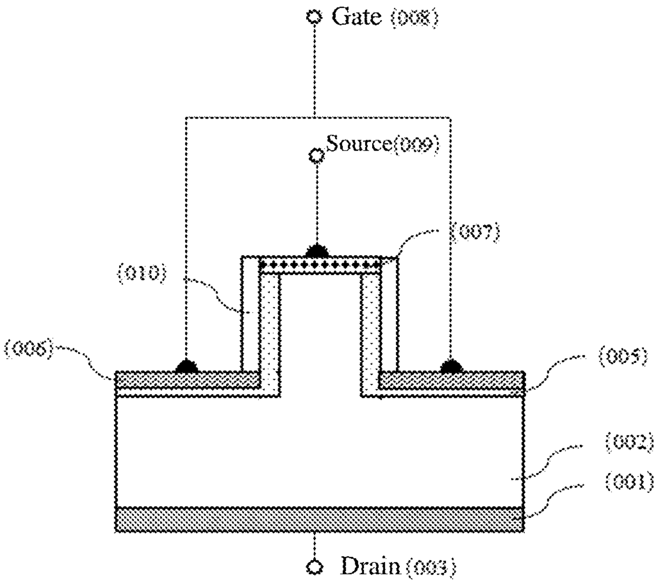
FIG. 6 is a schematic structural diagram of forming a gate and a source according to Method Embodiment 1.

(e) With reference to FIG. 6, a metal is deposited and a silicide is formed, by annealing, on the surfaces of the first conductivity type of a gate, a source, and a drain, respectively, as ohmic contacts, i.e., a gate, a source and a drain are formed.

Those skilled in the art can understand that, in some specific application examples, the first conductivity type is N type, and the second conductivity type is P type. In some other application examples, the first conductivity type is P type, and the second conductivity type is N type.

In a preferred application example, the doping of the first conductivity type and the second conductivity type is a uniform or non-uniform doping of $1\times10^{14}$ $cm^{-3}$-$2\times10^{21}$ $cm^{-3}$.

In a preferred application example, the semiconductor epitaxial layer 002 of the first conductivity type has a thickness of 5-250 μm and a doping concentration of $1\times10^{14}$ $cm^{-3}$-$5\times10^{18}$ $cm^{-3}$.

Method Embodiment 2

Figure 7:
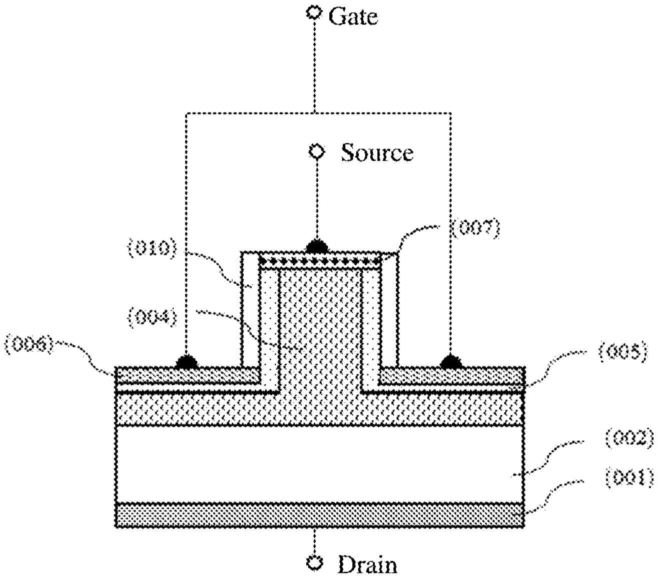
FIG. 7 is a schematic structural diagram of forming a channel implantation region according to Method Embodiment 2.

On the basis of Method Embodiment 1, with further reference to FIG. 7, a channel implantation region 004 formed by at least one tilt implantation is added on the basis of step (b). The implantation energy this time is higher than the implantation energy of ion implantation of the floating region using the same photolithography mask, and the implantation this time is deeper, thereby changing the doping concentration of the epitaxial layer. The implantation energy does not stop at the surface of the trench, but reaches the channel, thereby increasing the implantation concentration of the channel, so as to further reduce the on-resistance Rdson.

Method Embodiment 3

Figure 8:
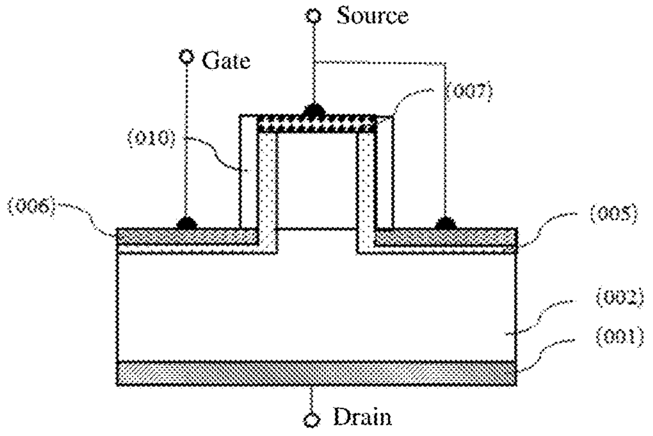
FIG. 8 is a schematic structural diagram of connecting one gate to a source according to Method Embodiment 3.

On the basis of Method Embodiment 1 and Method Embodiment 2, with reference to FIG. 8, the method further includes step (f): the gate implantation region 006 on one side of the cell is connected to the gate 008, and the gate implantation region 006 on another side of the cell and the source implantation region 007 are jointly connected to the source 009, so that the structure allows a reduced Cgd, thereby reducing the switching loss.

Method Embodiment 4

Figure 9:
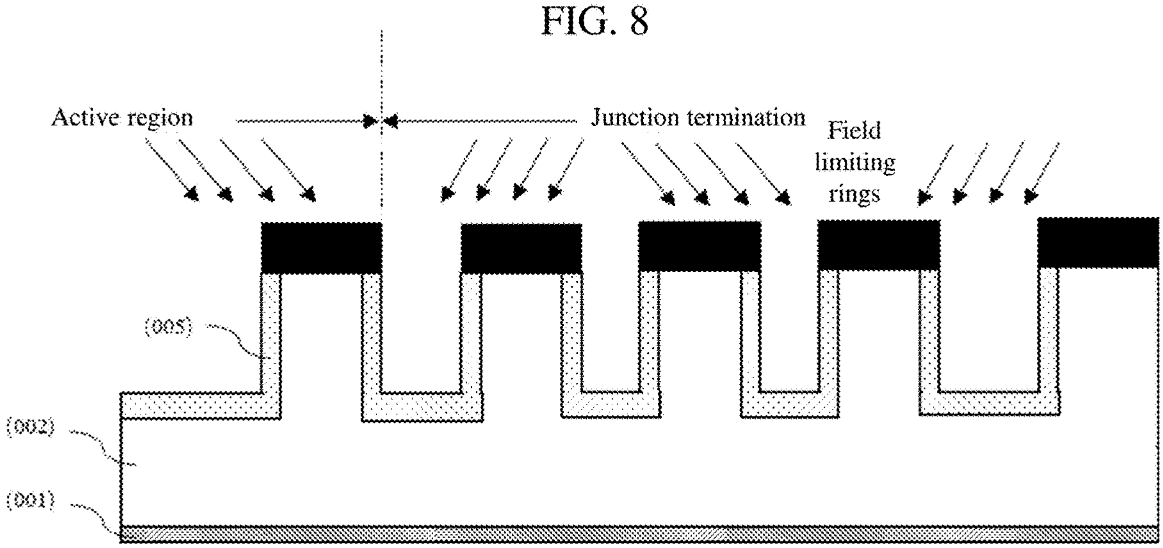
FIG. 9 is a schematic structural diagram of simultaneous etching and implantation of a junction termination and an active region of cell structures according to Method Embodiment 4.

With reference to FIG. 9, an embodiment of the present disclosure further provides a method for preparing a field effect transistor having same gate and source doping, in which the field effect transistor includes a plurality of cell structures and a field limiting ring junction termination. The cell structures are prepared by any of Method Embodiments 1 to 3, and when the junction termination is fabricated, the junction termination and the floating regions of the second conductivity type of the cell structures are etched and implanted simultaneously using the same photolithography mask.

Method Embodiment 5

Figure 10:
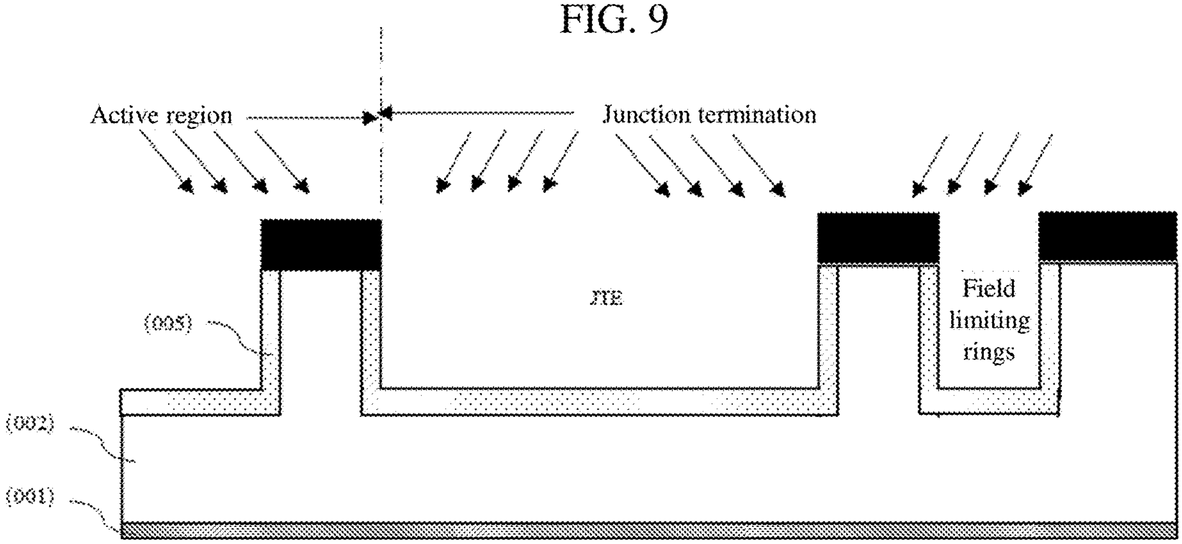
FIG. 10 is a schematic structural diagram of simultaneous etching and implantation of a junction termination and an active region of the cell structures according to Method Embodiment 5.

With reference to FIG. 10, an embodiment of the present disclosure further provides a method for preparing a field effect transistor having same gate and source doping, in which the field effect transistor includes a plurality of cell structures, a junction termination extension, and a junction termination with field limiting rings. The cell structures are prepared by any of Method Embodiments 1 to 3, and when the junction termination is fabricated, the junction termination and the floating regions of the second conductivity type of the cell structures are etched and implanted simultaneously using the same photolithography mask.

Through the above methods, a cell structure for a field effect transistor having same gate and source doping and a field effect transistor having same gate and source doping can be prepared, which will be described in detail below through structure embodiments.

Structure Embodiment 1

With reference to FIG. 6, a cell structure for a field effect transistor having same gate and source doping prepared by Method Embodiment 1 includes:

a silicon carbide substrate 001 with a doping type of a first conductivity type, a semiconductor epitaxial layer 002 of the first conductivity type and a first electrode 003 (i.e., a drain as shown in the figure) provided on front and back faces of the silicon carbide substrate 001, respectively; and a floating region 005 of a second conductivity type, a gate implantation region 006 of the first conductivity type, and a source implantation region 007 of the first conductivity type sequentially provided on the semiconductor epitaxial layer 002 of the first conductivity type, wherein a gate 008 is provided on the gate implantation region 006, a source 009 is provided on the source implantation region, an inter-electrode dielectric 010 is provided between the gate implantation region 006 and the source implantation region 007, and the inter-electrode dielectric 010 is used for isolating the gate 008 from the source 009.

In a preferred application example, the semiconductor epitaxial layer 002 of the first conductivity type has a thickness of 5-250 μm and a doping concentration of $1\times10^{14}$ $cm^{-3}$-$5\times10^{18}$ $cm^{-3}$.

Figure 13:
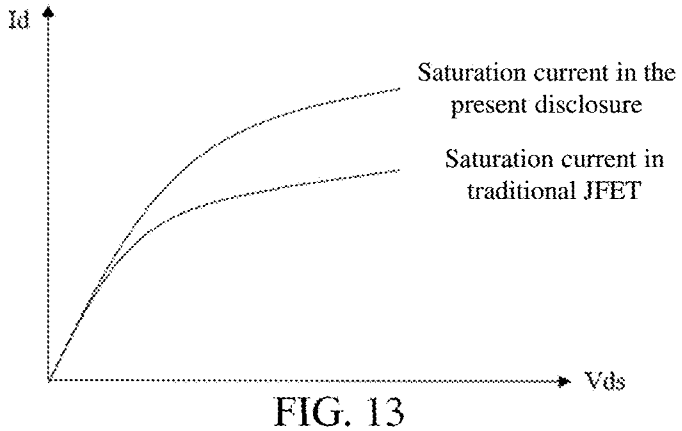
FIG. 13 is a comparative schematic diagram showing that a voltage that can be applied to the gate is increased compared with a traditional JFET device.
Figure 14:
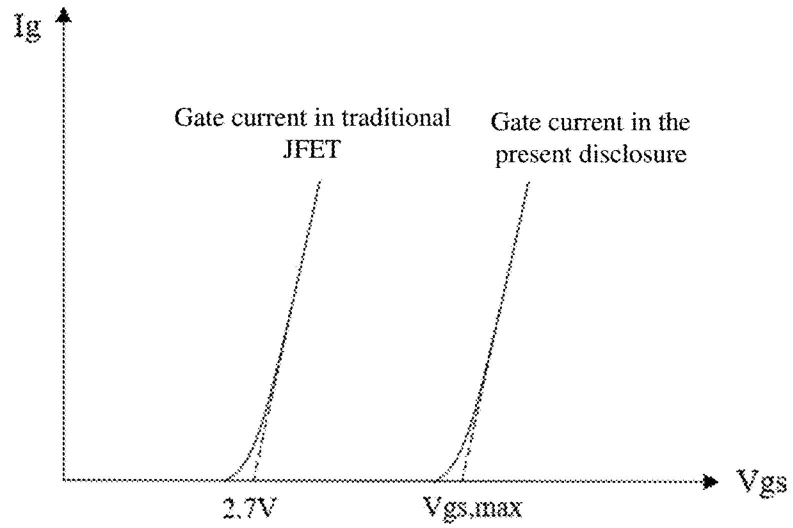
FIG. 14 is a comparative schematic diagram showing that a saturation current is increased compared with a traditional JFET device.

Embodiments of the present disclosure introduce a gate of a first conductivity type and a floating region of a second conductivity type that surrounds the gate on the basis of the traditional JFET to control the channel of the device. A forward bias voltage of the gate of the device can be increased, so that Vgs can be biased at a position greater than a forward cut-in voltage of a PN junction (taking silicon carbide for example, Vgs=20 V). Meanwhile, when Vgs=0 V, because there is no reverse bias introduced by the built-in potential in the PN junction at the channel, the on-resistance of the device is lower. When turned on at a high current, the device enters a saturation state to conduct higher current. That is, compared with the traditional JFET device, the present disclosure improves the voltage that can be applied to the gate and the saturation current, as shown in FIG. 13 and FIG. 14.

In a preferred application example, the doping of the first conductivity type and the second conductivity type is uniform or non-uniform doping of $1\times10^{14}$ $cm^{-3}$-$2\times10^{21}$ $cm^{-3}$.

Structure Embodiment 2

With reference to FIG. 7, a cell structure for a field effect transistor having same gate and source doping is prepared by Method Embodiment 2. On the basis of Structure Embodiment 1, the channel implantation region 004 is formed by adding at least one tilt implantation on the epitaxial layer.

Figure 11:
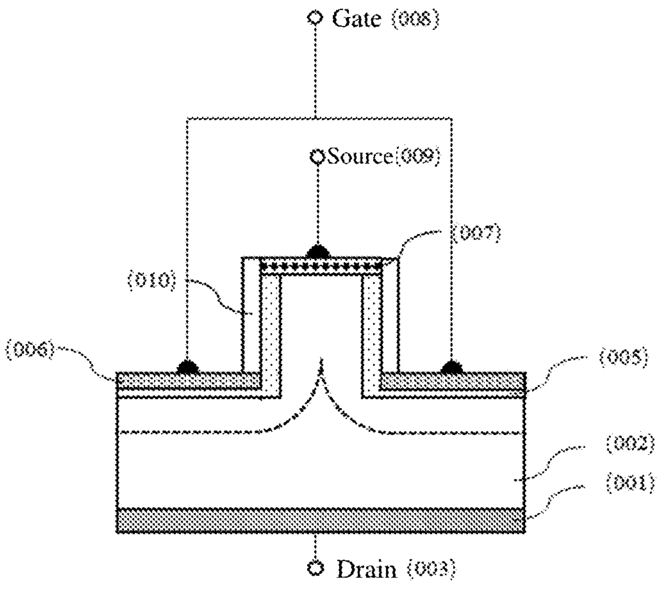
FIG. 11 is a schematic structural diagram of closing of a space charge region between the channel implantation region and the floating region of the second conductivity type when the device is turned off.
Figure 12:
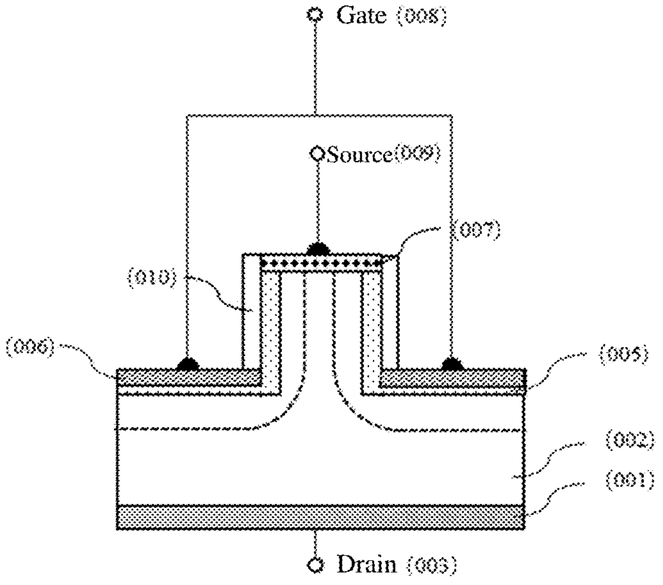

By adjusting the doping concentrations of the channel implantation region 004 and the floating region 005 of the second conductivity type, a threshold voltage of the JFET device can be adjusted. With reference to FIG. 11, when the device is turned off, a space charge region between the channel implantation region 004 and the floating region 005 of the second conductivity type is closed. With reference to FIG. 12, when the device is turned on, the space charge region is separated.

Structure Embodiment 3

With reference to FIG. 8, on the basis of Structure Embodiment 1 and Structure Embodiment 2, one gate is connected to the source, so that the structure allows a reduced Cgd, thereby reducing the switching loss.

Structure Embodiment 4

On the basis of Structure Embodiment 1 and the Structure Embodiment 2, with reference to FIG. 8, the gate implantation region 006 on one side of the cell is connected to the gate 008, and the gate implantation region 006 on another side of the cell and the source implantation region 007 are jointly connected to the source 009, so that the structure allows a reduced Cgd, thereby reducing the switching loss.

Structure Embodiment 5

With reference to FIG. 9, a field effect transistor having same gate and source doping, provided by an embodiment of the present disclosure, includes a plurality of cell structures according to any of Structure Embodiments 1 to 4 and a field limiting ring junction termination. When the junction termination is fabricated, the junction termination and the floating regions of the second conductivity type of the cell structures are etched and implanted simultaneously using the same photolithography mask.

Structure Embodiment 6

With reference to FIG. 10, a field effect transistor having same gate and source doping is characterized in that the field effect transistor includes a plurality of cell structures according to any of Structure Embodiments 1 to 4, a junction termination extension, and a junction termination with field limiting rings. When the junction termination is fabricated, the junction termination and the floating regions of the second conductivity type of the cell structures are etched and implanted simultaneously using the same photolithography mask.

Structure Embodiment 7

Figure 15:
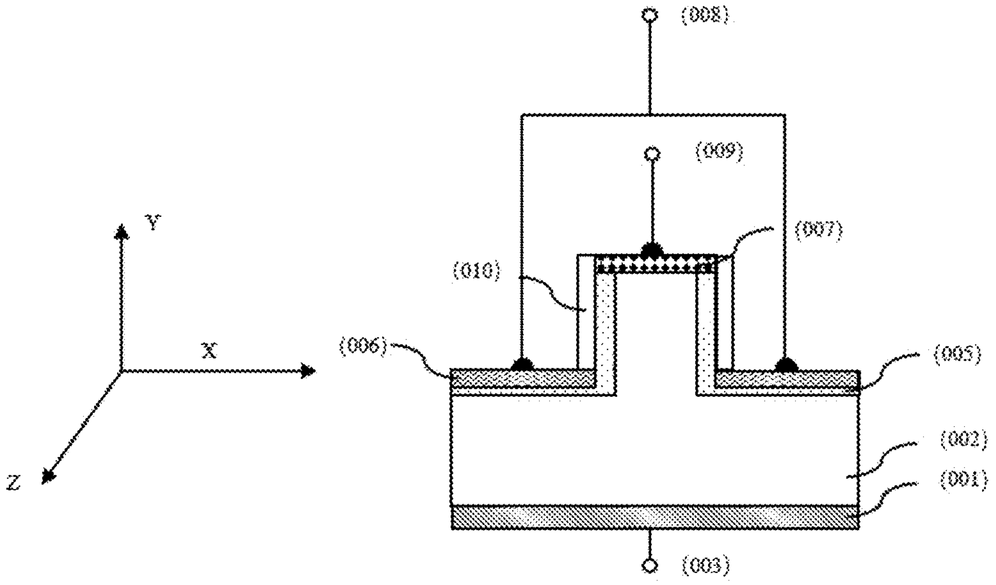
FIG. 15 is a schematic cross-sectional structural diagram of a cell structure for a field effect transistor having same gate and source doping according to yet another embodiment of the present disclosure.

With reference to FIG. 15, an embodiment of the present disclosure discloses a cell structure for a field effect transistor having same gate and source doping. FIG. 15 shows a cross-sectional view of an XY plane in a spatial rectangular coordinate system. The cell structure includes:

a silicon carbide substrate 001 with a doping type of a first conductivity type, a semiconductor epitaxial layer 002 of the first conductivity type and a first electrode 003 provided on front and back faces of the silicon carbide substrate 001, respectively; and a floating region 005 of a second conductivity type, a implantation region 006 of the first conductivity type gate, and a source implantation region 007 of the first conductivity type sequentially provided on the semiconductor epitaxial layer 002 of the first conductivity type, wherein a gate 008 is provided on the gate implantation region 006 of the first conductivity type, a source 009 is provided on the source implantation region 007 of the first conductivity type, an inter-electrode dielectric 010 is provided between the gate implantation region 006 of the first conductivity type and the source implantation region 007 of the first conductivity type, and the inter-electrode dielectric 010 is used for isolating the gate 008 from the source 009. A portion of the floating region 005 of the second conductivity type in contact with the source implantation region 007 of the first conductivity type has the same structure as the source implantation region 007 of the first conductivity type, and both are provided with terminal sharp angles.

Figure 16:
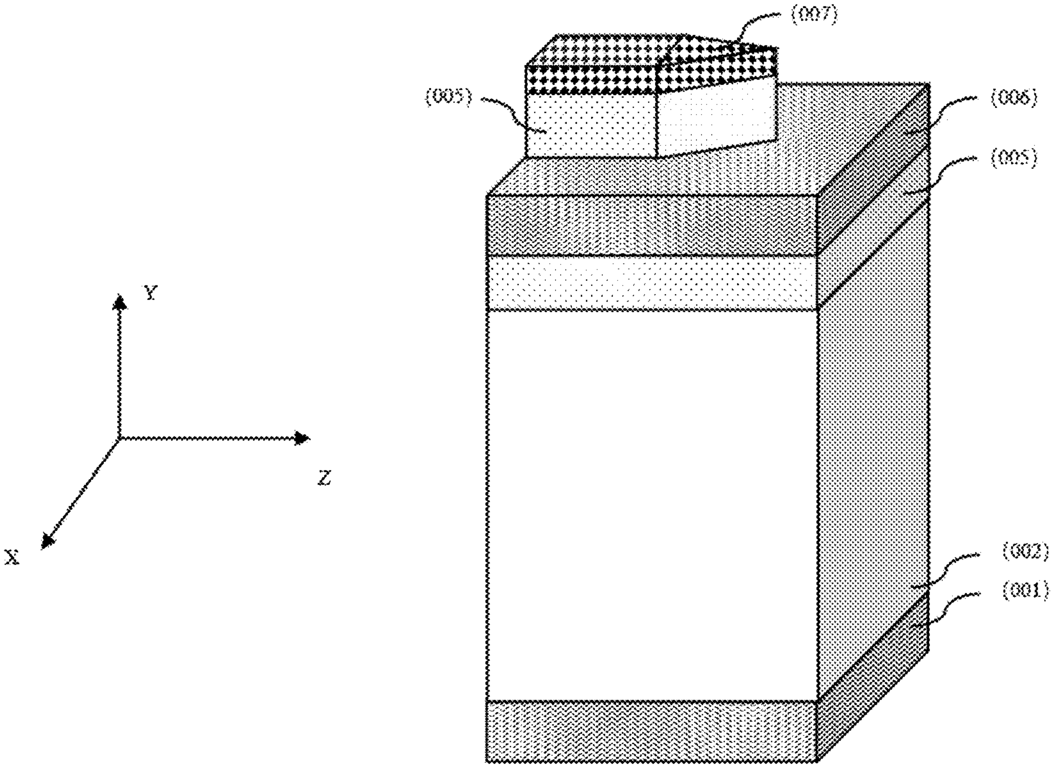
FIG. 16 is a schematic three-dimensional structural diagram of a semiconductor floating region of the second conductivity type having a terminal sharp angle in a cell structure for a field effect transistor having same gate and source doping according to yet another embodiment of the present disclosure.
Figure 17:
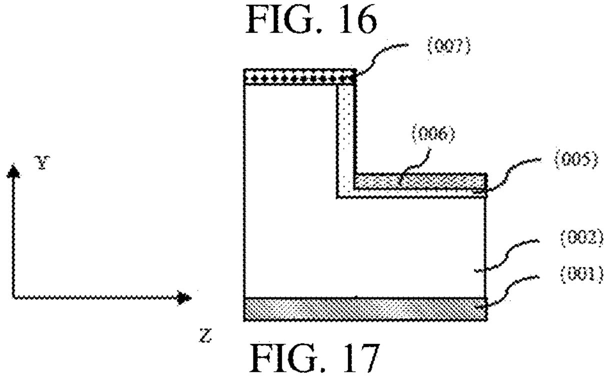
FIG. 17 is a schematic cross-sectional structural diagram of a semiconductor floating region of the second conductivity type having a terminal sharp angle in a cell structure for a field effect transistor having same gate and source doping according to yet another embodiment of the present disclosure.
Figure 18:
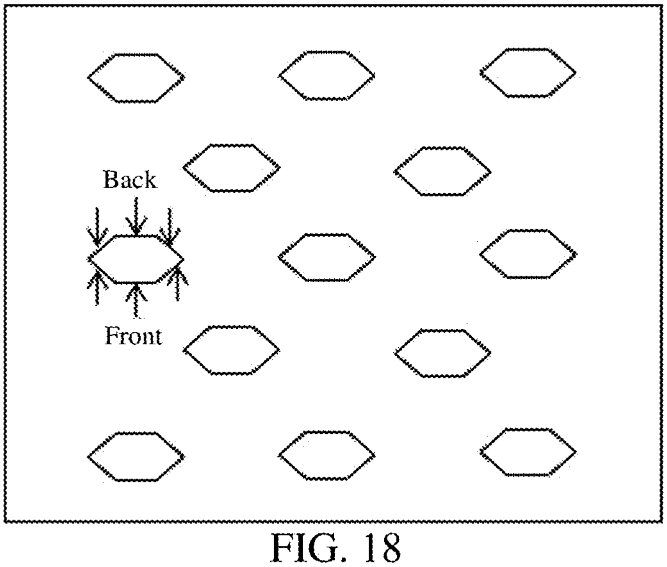
FIG. 18 is a top view of an active region layout of a device having cells with terminal sharp angles.
Figure 19:
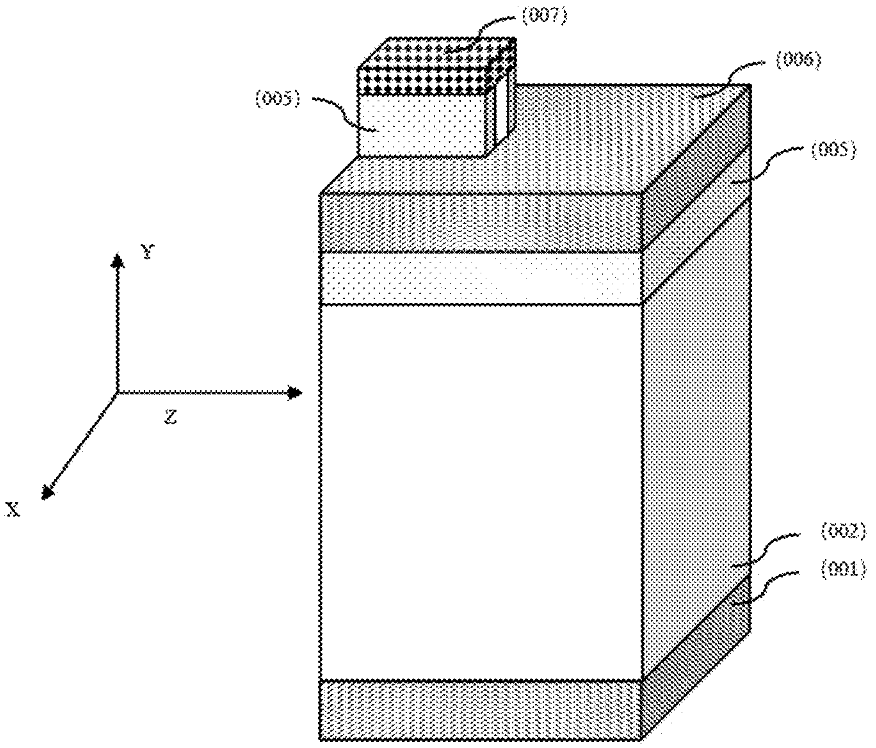
FIG. 19 is a schematic three-dimensional structural diagram of a rectangular semiconductor floating region of the second conductivity type in a cell structure for a field effect transistor having same gate and source doping according to yet another embodiment of the present disclosure.
Figure 20:
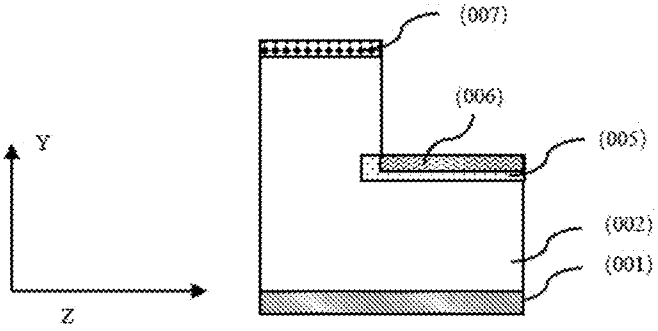
FIG. 20 is a schematic cross-sectional structural diagram of a rectangular semiconductor floating region of the second conductivity type in a cell structure for a field effect transistor having same gate and source doping according to yet another embodiment of the present disclosure.
Figure 21:
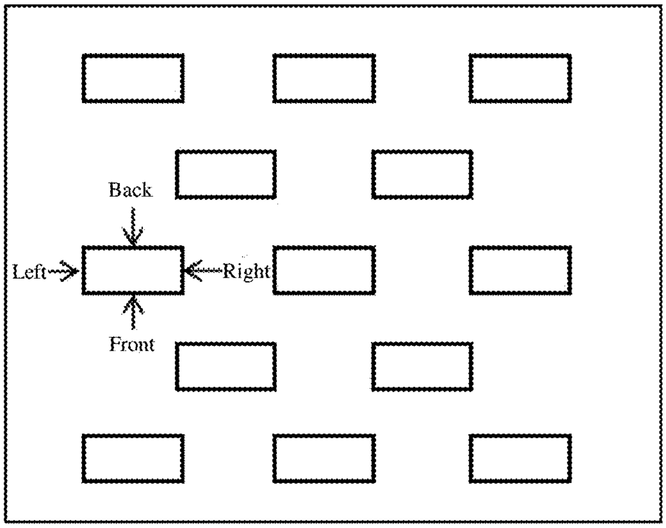
FIG. 21 is a top view of an active region layout of a device having rectangular cells.

With reference to FIG. 19 to FIG. 21, for the fabrication of devices with the above cross-sectional structures, square and rectangular layouts are often used for etching and implantation. FIG. 19 is a three-dimensional diagram of a smallest half cell structure, FIG. 20 is a cross-sectional view of a YZ plane, and FIG. 21 is a top view of an active region layout of a device with rectangular cells. In the cell structures of JFET devices with the above structures, because a gate of a first conductivity type and a floating region of a second conductivity type that surrounds the gate are introduced to control the channel of the device, implantations in four directions from the front, back, left, and right are required in the trench-based device to avoid a gate-source short circuit. As shown in FIG. 21, only one side of the cell can be implanted each time. If implantations in two directions (only including front and back) are performed, the first conductivity type may run through an edge portion of the cell of the device, resulting in a gate-source short circuit (FIG. 20). In order to shorten the production cycle and reduce the cost, the number of implantations should be reduced as much as possible in practice. Embodiments of the present disclosure avoid this problem by introducing a cell layout structure with terminal sharp angles in the floating region 005 of the second conductivity type. Three front-facing faces of the cell structure may be implanted at the same time during front implantation, and three back-facing faces of the cell structure may also be implanted at the same time during back implantation, as shown in FIG. 18, so that implantations in four directions may be reduced to implantations in two directions, which can shorten the implantation cycle by half. For example, the structures shown in FIG. 19 to FIG. 21 require implantations in four directions, in which the implantation in each direction takes 2 hours, and a total of 8 hours is required, while the structures shown in FIG. 16 to FIG. 18 require implantations in only the front and back directions, in which the implantation in each direction takes 2 hours, and a total of 4 hours is required. As shown in FIG. 16 to FIG. 18, FIG. 16 is a three-dimensional diagram of a smallest half cell structure, FIG. 17 is a cross-sectional view of a YZ plane, and FIG. 18 is a top view of active region layout of a device having cells with terminal sharp angles.

Further, in a specific application example, the terminal sharp angle is 0-180 degrees.

Those skilled in the art can understand that, in some specific application examples, the first conductivity type is N type, and the second conductivity type is P type. In some other application examples, the first conductivity type is P type, and the second conductivity type is N type.

In a preferred application example, the doping of the first conductivity type and the second conductivity type is a uniform or non-uniform doping of $1\times10^{14}$ $cm^{-3}$-$2\times10^{21}$ $cm^{-3}$.

In a preferred application example, the semiconductor epitaxial layer 002 of the first conductivity type has a thickness of 5-250 μm and a doping concentration of $1\times10^{14}$ $cm^{-3}$-$5\times10^{18}$ $cm^{-3}$.

It should be understood that the exemplary embodiments described herein are illustrative but not restrictive. Although one or more embodiments of the present disclosure are described in conjunction with the accompanying drawings, those of ordinary skill in the art should appreciate that various changes in form and detail can be made without departing from the spirit and scope of the present disclosure as defined by the appended claims.

The invention claimed is:

1. A cell structure for a field effect transistor having same gate and source doping, comprising:

a silicon carbide substrate with a doping type of a first conductivity type, a semiconductor epitaxial layer of a first conductivity type and a first electrode provided on front and back faces of the silicon carbide substrate, respectively;

a floating region of a second conductivity type, a gate implantation region of the first conductivity type, and a source implantation region of the first conductivity type provided on the semiconductor epitaxial layer of the first conductivity type; and a channel implantation region disposed in the semiconductor epitaxial layer at a depth greater than a depth to which the floating region extends from a surface of a trench, wherein a doping concentration of the channel implantation region is higher than a doping concentration of a remaining portion of the semiconductor epitaxial layer, wherein the trench comprises bottom and side walls and is formed by etching a silicon carbide mesa using a photolithography mask, and the floating region is formed by implantation into the bottom and side walls of the trench, wherein a gate is provided on the gate implantation region, a source is provided on the source implantation region, an inter-electrode dielectric is provided between the gate implantation region of the first conductivity type and the source implantation region of the first conductivity type, and wherein in plan view, the source implantation region and the floating region each comprises a substantially hexagonal outline defined by six side faces, including three front-facing faces and three back-facing faces.

2. The cell structure for the field effect transistor having same gate and source doping according to claim 1, wherein a portion of the floating region of the second conductivity type in contact with the source implantation region of the first conductivity type has a same surface geometry as the source implantation region of the first conductivity type, and both are provided with terminal sharp angles.

3. The cell structure for the field effect transistor having same gate and source doping according to claim 2, wherein the terminal sharp angles are 0-180 degrees.

4. The cell structure for the field effect transistor having same gate and source doping according to claim 1, wherein the semiconductor epitaxial layer of the first conductivity type has a thickness of 5-250 μm and a doping concentration of $1\times10^{14}$ $cm^{-3}$-$5\times10^{18}$ $cm^{-3}$.

5. The cell structure for the field effect transistor having same gate and source doping according to claim 1, wherein the gate implantation region on one side of the cell is connected to the gate, and the gate implantation region on another side of the cell and the source implantation region are jointly connected to the source.

6. The cell structure for the field effect transistor having same gate and source doping according to claim 1, wherein a doping of the first conductivity type and the second conductivity type is a uniform or non-uniform doping of $1\times10^{14}$ $cm^{-3}$-$2\times10^{21}$ $cm^{-3}$.

7. The cell structure for the field effect transistor having same gate and source doping according to claim 1, wherein the first conductivity type is N type, and the second conductivity type is P type.

8. The cell structure for the field effect transistor having same gate and source doping according to claim 1, wherein the first conductivity type is P type, and the second conductivity type is N type.

9. A field effect transistor having same gate and source doping, comprising the plurality of cell structures according to claim 1 and a field limiting ring junction termination, wherein when the field limiting ring junction termination is fabricated, the field limiting ring junction termination and the floating regions of the second conductivity type of the cell structures are etched and implanted simultaneously using a same photolithography mask.

10. A field effect transistor having same gate and source doping, comprising the plurality of cell structures according to claim 1, a junction termination extension, and a junction termination with field limiting rings, wherein when the junction termination is fabricated, the junction termination and the floating regions of the second conductivity type of the cell structures are etched and implanted simultaneously using a same photolithography mask.

11. The cell structure for the field effect transistor having same gate and source doping according to claim 1, wherein the floating region is formed by ion implantation performed from only two opposite directions, including a front-direction implantation that implants the three front-facing faces and a back-direction implantation that implants the three back-facing faces.

12. A method for preparing a cell structure for a field effect transistor having same gate and source doping, comprising following steps:

(a) using a silicon carbide substrate with a doping type of a first conductivity type, and providing a semiconductor epitaxial layer of the first conductivity type on a front face of the silicon carbide substrate; using a photolithography plate (photolithography mask) to shield a portion of a surface, and etching on the front face of the silicon carbide substrate where the semiconductor epitaxial layer is provided, a silicon carbide mesa by an etching process, with an etching depth of 0.5 to 5 μm;

(b) performing ion implantation of a floating region by using the same photolithography mask, wherein the specific process comprises forming a floating region of a second conductivity type by at least one tilt implantation and vertical implantation of Al ions, so that bottom and side walls of a trench formed by the etching process of step (a) are uniformly implanted;

(c) peeling off the mask layer and performing vertical N implantation to form a gate implantation region and a source implantation region, of the first conductivity type;

(d) growing a dielectric layer on the side walls of the trench as an electrode isolation dielectric to isolate a gate from a source; and (e) depositing a metal and annealing to form an alloy on surfaces of the gate implantation region, the source implantation region, and the substrate, of the first conductivity type, respectively, as ohmic contacts, wherein the alloy contains at least one of a silicide or a carbide, wherein step (b) further comprises disposing a channel implantation region in the semiconductor epitaxial layer at a depth greater than a depth to which the floating region extends from a surface of the trench, wherein a doping concentration of the channel implantation region is higher than a doping concentration of a remaining portion of the semiconductor epitaxial layer, and wherein in plan view, the source implantation region and the floating region each comprises a substantially hexagonal outline defined by six side faces, including three front-facing faces and three back-facing faces.

13. The method for preparing the cell structure for the field effect transistor having same gate and source doping according to claim 12, wherein the first conductivity type is N type, and the second conductivity type is P type.

14. The method for preparing the cell structure for the field effect transistor having same gate and source doping according to claim 12, wherein the first conductivity type is P type, and the second conductivity type is N type.

15. A method for preparing a field effect transistor having same gate and source doping, wherein the field effect transistor comprises a plurality of cell structures and a field limiting ring junction termination, the cell structures are prepared by the method according to claim 12, and when the field limiting ring junction termination is fabricated, the field limiting ring junction termination and the floating regions of the second conductivity type of the cell structures are etched and implanted simultaneously using a same photolithography mask.

16. A method for preparing a field effect transistor having same gate and source doping, wherein the field effect transistor comprises a plurality of cell structures, a junction termination extension, and a junction termination with field limiting rings, the cell structures are prepared by the method according to claim 12, and when the junction termination is fabricated, the junction termination and the floating regions of the second conductivity type of the cell structures are etched and implanted simultaneously using a same photolithography mask.

* * * * *